US005153171A

United States Patent [19]

Smith et al.

[11] Patent Number: 5,153,171

[45] Date of Patent: Oct. 6, 1992

[54] SUPERCONDUCTING VARIABLE PHASE SHIFTER USING SQUID'S TO EFFECT PHASE SHIFT

[75] Inventors: Andrew D. Smith, Redondo Beach; Arnold H. Silver, Rancho Palos Verdes; Charles M. Jackson, Lawndale, all of Calif.

[73] Assignee: TRW Inc., Redondo Beach, Calif.

[21] Appl. No.: 583,734

[22] Filed: Sep. 17, 1990

[51] Int. Cl.[5] ........................ H01P 1/18; H01L 39/22

[52] U.S. Cl. ........................................ 505/1; 505/701; 505/702; 505/866; 505/874; 333/161; 333/164; 333/99 S

[58] Field of Search .............. 333/161, 164, 139, 99 S; 505/1, 700, 701, 702, 854, 855, 866, 874; 307/306; 357/5; 324/248

[56] References Cited

U.S. PATENT DOCUMENTS

| | | | |
|---|---|---|---|
| H653 | 7/1989 | Conrad | 343/792 |
| 3,290,624 | 12/1966 | Hines | 333/164 |
| 4,344,052 | 8/1982 | Davidson | 333/222 |
| 4,468,635 | 8/1984 | Lukens et al. | 331/107 S |
| 4,470,023 | 9/1984 | Lukens et al. | 505/854 X |
| 4,499,441 | 2/1985 | Lynch et al. | 505/866 X |
| 4,876,239 | 10/1989 | Cachier | 505/1 |

FOREIGN PATENT DOCUMENTS

| | | | |
|---|---|---|---|
| 3815636 | 11/1989 | Fed. Rep. of Germany | 505/702 |
| 76402 | 3/1980 | Japan | 333/99 S |
| 239104 | 11/1985 | Japan | 333/164 |

OTHER PUBLICATIONS

Zimmerman, J. E. et al., "Operation of a Y-Ba-Cu-O RF SQUID at 81° K" NBS Paper Submitted to *Applied Physics Letters;* 1987.

*Primary Examiner*—LaRoche
*Assistant Examiner*—Benny T. Lee
*Attorney, Agent, or Firm*—James M. Steinberger; Goldstein, Sol L.

[57] ABSTRACT

A superconducting variable phase shifter providing improved performance in the microwave and millimeter wave frequency ranges. The superconducting variable phase shifter includes a transmission line and an array of superconducting quantum interference devices (SQUID's) connected in parallel with and distributed along the length of the transmission line. A DC control current $I_{DC}$ varies the inductance of the individual SQUID's and thereby the distributed inductance of the transmission line, thus controlling the propagation speed, or phase shift, of signals carried by the transmission line. The superconducting variable phase shifter provides a continuously variable time delay or phase shift over a wide signal bandwidth and over a wide range of frequencies, with an insertion loss of less than 1 dB. The phase shifter requires less than a milliwatt of power and, if one or more of the Josephson junctions fails, the whole device remains operational, since the SQUID's are connected in parallel.

12 Claims, 1 Drawing Sheet

SUPERCONDUCTING VARIABLE PHASE SHIFTER USING SQUID'S TO EFFECT PHASE SHIFT

BACKGROUND OF THE INVENTION

This invention relates generally to variable time delay lines or phase shifters and, more particularly, to variable phase shifters that operate in the microwave and millimeter wave frequency ranges.

Variable time delay lines or phase shifters are utilized in a wide variety of electronic devices for controlling the phase relationships of signals. One electronic device that relies heavily on phase shifters is a phased array antenna. A typical phased array antenna includes a planar array of radiating elements and an associated array of phase shifters. The radiating elements generate a beam having a planar wavefront and the phase shifters vary the phase front of the beam to control its direction and shape.

Phase shifters generally can be grouped into one of two categories. One category of phase shifter utilizes the variable permeability of ferrites to control the phase shift of signals. This type of phase shifter typically includes a thin ferrite rod centered within a rectangular waveguide. A magnetic field applied to the ferrite rod by an induction coil wrapped around the waveguide varies the permeability of the ferrite rod, thus controlling the propagation speed, or phase shift, of signals carried by the waveguide. The other category of phase shifter utilizes different signal path lengths to control the phase shift of signals. This type of phase shifter typically includes a bank of diodes and various lengths of conductors which are switched into or out of the signal path by the diodes, thus controlling the propagation time, or phase shift, of signals carried by the conductors.

Although both types of phase shifters are widely used, each has certain limitations, especially when used in the microwave and millimeter wave frequency ranges. These limitations include large insertion losses, high power requirements, and limited frequency ranges and bandwidths. Accordingly, there has been a need for an improved variable phase shifter that does not suffer from these limitations. The present invention clearly fulfills this need.

SUMMARY OF THE INVENTION

The present invention resides in a superconducting variable phase shifter having improved performance in the microwave and millimeter wave frequency ranges. The superconducting variable phase shifter includes a transmission line and an array of superconducting quantum interference devices (SQUID's) connected in parallel with and distributed along the length of the transmission line. A DC control current $I_{DC}$ varies the inductance of the individual SQUID's and thereby the distributed inductance of the transmission line, thus controlling the propagation speed, or phase shift, of signals carried by the transmission line.

In a preferred embodiment of the present invention, the superconducting variable phase shifter includes a microstrip transmission line and an array of single-junction SQUID's connected in parallel with and distributed along the length of the transmission line. The microstrip transmission line includes a line conductor, a ground plane, and a dielectric layer sandwiched between the conductor and ground plane. The single-junction SQUID's are arranged on the top face of and electrically connected in parallel with the ground plane. Each of the single-junction SQUID's includes a Josephson tunnel junction and a superconducting loop connected around the tunnel junction.

In another preferred embodiment of the present invention, the superconducting variable phase shifter includes a strip transmission line and an array of double-junction SQUID's connected in parallel with and distributed along the length of the transmission line. The strip transmission line includes a line conductor, upper and lower ground planes, and upper and lower dielectric layers sandwiched between the conductor and the ground planes. The double-junction SQUID's are arranged on the top face of and electrically connected in parallel with the lower ground plane. Each of the double-junction SQUID's includes two Josephson tunnel junctions and a superconducting loop connected around the two tunnel junctions. The control current $I_{DC}$ is inductively coupled to the transmission line by an inductor, rather than being supplied directly to the transmission line.

The superconducting variable phase shifter of the present invention provides a continuously variable time delay or phase shift over a wide signal bandwidth and over a wide range of frequencies, with an insertion loss of less than 1 dB. The phase shifter requires less than a milliwatt of power and, if one or more of the Josephson junctions fails, the whole device remains operational, since the SQUID's are connected in parallel. The superconducting variable phase shifter of the present invention is not only useful in phased array antennas, but also in interferometers, surveillance receivers and microwave signal processing. The phase shifter can also be used in millimeter wave integrated circuits, such as variable attenuators, switches and power dividers.

The superconducting phase shifter of the present invention can also operate in a nonlinear mode for large high-frequency signals. Large signals self modulate the inductance of the SQUID's, providing a nonlinear magnetic medium for generating harmonics of the high-frequency signals. This mode of operation can be used to provide harmonic response, mixing and parametric amplification for these large high-frequency signals.

It will be appreciated from the foregoing that the present invention represents a significant advance in the field of variable phase shifters. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 2:
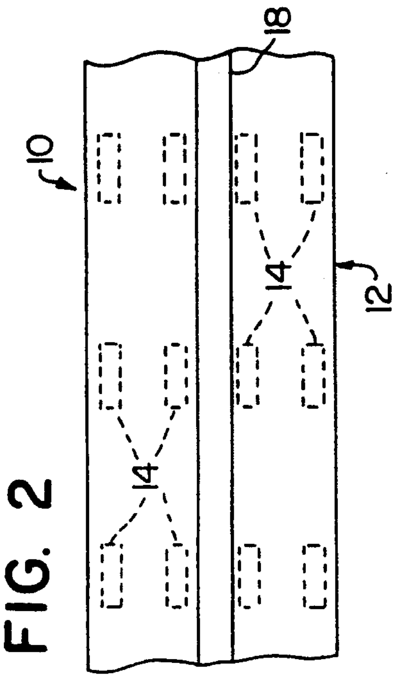
FIG. 2 is a fragmented plan view of the superconducting variable phase shifter shown in FIG. 1.

As shown in the drawings for purposes of illustration, the present invention is embodied in a superconducting variable phase shifter having improved performance in the microwave and millimeter wave frequency ranges. Variable time delay lines or phase shifters are utilized in a wide variety of electronic devices for controlling the phase relationships of signals. One category of phase shifter utilizes the variable permeability of ferrites to control the phase shift of signals, while another category utilizes different signal path lengths to control the phase shift of signals. Although both types of phase shifters are widely used, each has certain limitations, especially when used in the microwave and millimeter wave frequency ranges.

In accordance with the present invention, a superconducting variable phase shifter includes a transmission line and an array of superconducting quantum interference devices (SQUID's) connected in parallel with and distributed along the length of the transmission line. A DC control current $I_{DC}$ varies the inductance of the individual SQUID's and thereby the distributed inductance of the transmission line, thus controlling the propagation speed, or phase shift, of signals carried by the transmission line.

Figure 1:
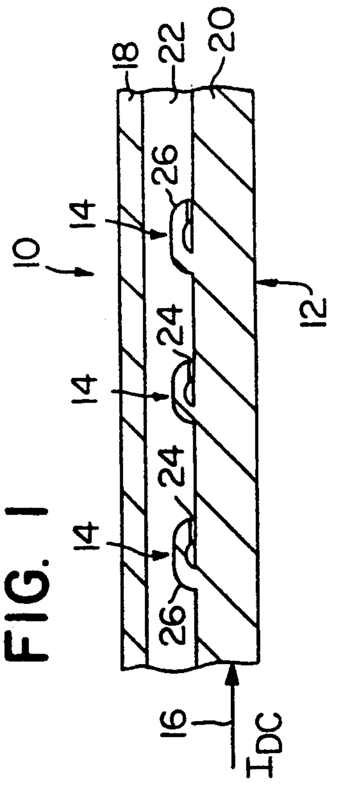
FIG. 1 is a fragmented sectional view of a superconducting variable phase shifter in accordance with a preferred embodiment of the present invention.

As illustrated in FIGS. 1 and 2, a superconducting variable phase shifter 10 in accordance with a preferred embodiment of the present invention includes a microstrip transmission line 12 and an array of single-junction SQUID's 14 connected in parallel with and distributed along the length of the transmission line 12. As shown in FIG. 1, a DC control current $I_{DC}$, on line 16, varies the inductance of the individual SQUID's 14. The microstrip transmission line 12 includes a line conductor 18, a ground plane 20, and a dielectric layer 22 sandwiched between the conductor 18 and ground plane 20. The single-junction SQUID's 14 are arranged on the top face of and electrically connected in parallel with the ground plane 20.

Each of the single-junction SQUID's 14 includes a Josephson tunnel junction 24 and a superconducting loop 26 connected around the tunnel junction. The single-junction SQUID 14 exhibits a periodic and nonlinear relationship between the current injected into the superconducting loop and the magnetic flux threading it. Consequently, each SQUID 14 contributes a varying amount of flux quantum, and therefore inductance, to the transmission line 12, depending on the magnitude of the control current $I_{DC}$. An increase in the control current $I_{DC}$ decreases the inductance of each SQUID 14, thus increasing the propagation speed of signals carried by the transmission line 12, while a decrease in the control current increases the inductance of each SQUID 14, thus decreasing the propagation speed.

Figure 4:
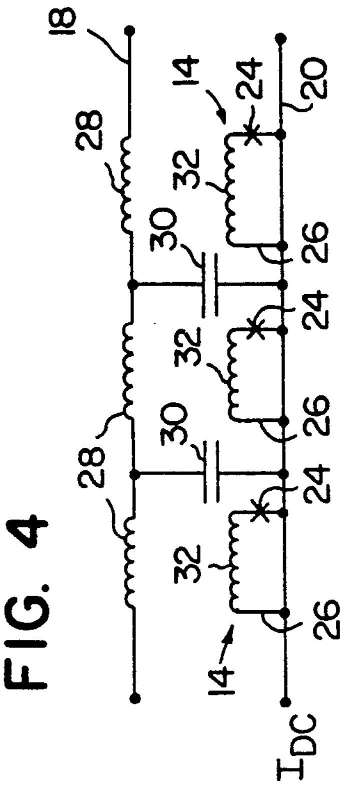
FIG. 4 is an equivalent circuit diagram of the superconducting variable phase shifter shown in FIG. 1.

FIG. 4 illustrates an equivalent circuit of the superconducting variable phase shifter 10 of the present invention. The transmission line 12 has a distributed inductance, represented by a plurality of inductors 28 connected in series, and a distributed capacitance represented by a plurality of capacitors 30 connected between the line conductor 18 and the ground plane 20. Each SQUID 14 includes the Josephson tunnel junction 24, the superconducting loop 26, and the inductance of the superconducting loop, which is represented by an inductor 32 connected in series with the Josephson junction 24. The propagation speed of a signal carried by the transmission line 12 is dependent on the inductance and capacitance per unit length of the transmission line 12. The SQUID's 14 do not affect the capacitance of the transmission line, but they do act as variable inductors, with the inductance of each SQUID 14 being determined by the amount of flux quantum threading the SQUID.

Figure 3:
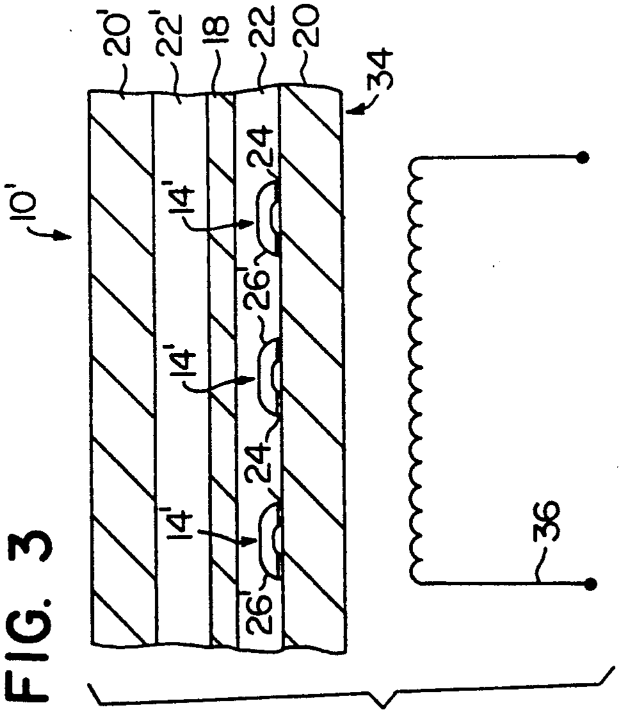
FIG. 3 is a fragmented sectional view of a superconducting variable phase shifter in accordance with another preferred embodiment of the present invention.

In another preferred embodiment of the present invention, as illustrated in FIG. 3, a superconducting variable phase shifter 10' includes a strip transmission line 34 and an array of double-junction SQUID's 14' connected in parallel with and distributed along the length of the transmission line 34. The strip transmission line 34 includes the line conductor 18, upper and lower ground planes 20', 20, and upper and lower dielectric layers 22', 22 sandwiched between the conductor 18 and the ground planes 20', 20. The double-junction SQUID's 14' are arranged on the top face of and electrically connected in parallel with the lower ground plane 20. Each of the double-junction SQUID's 14' includes two Josephson tunnel junctions 24 and a superconducting loop 26' connected around the two tunnel junctions. The control current $I_{DC}$ is inductively coupled to the transmission line 34 by an inductor 36, rather than being supplied directly to the transmission line by line 16.

In the preferred embodiments of the present invention, the SQUID's 14, 14' are fabricated using low temperature superconductor materials, such as niobium (Nb), and conventional planar low temperature superconducting fabrication techniques. However, high temperature superconductors can also be used, as well as other types of weak links, such as point contacts, micro bridges and granular films. The transmission line can be any transmission medium that controllably supports electromagnetic waves, including coaxial cables.

The superconducting variable phase shifter of the present invention provides a continuously variable time delay or phase shift over a wide signal bandwidth and over a wide range of frequencies, with an insertion loss of less than 1 dB. The phase shifter requires less than a milliwatt of power and, if one or more of the Josephson junctions fails, the whole device remains operational, since the SQUID's are connected in parallel. The superconducting variable phase shifter of the present invention is not only useful in phased array antennas, but also in interferometers, surveillance receivers and microwave signal processing. The phase shifter can also be used in millimeter wave integrated circuits, such as variable attenuators, switches and power dividers.

The superconducting phase shifter of the present invention can also operate in a nonlinear mode for large high-frequency signals. Large signals self modulate the inductance of the SQUID's 14, 14', providing a nonlinear magnetic medium for generating harmonics of the high-frequency signals. This mode of operation can be used to provide harmonic response, mixing and parametric amplification for these large high-frequency signals.

From the foregoing, it will be appreciated that the present invention represents a significant advance in the field of variable phase shifters. Although several preferred embodiments of the invention have been shown and described, it will be apparent that other adaptations and modifications can be made without departing from the spirit and scope of the invention. Accordingly, the invention is not to be limited, except as by the following claims.

We claim:

1. A superconducting variable phase shifter for controlling the propagation speed, or phase shift, of signals applied to the phase shifter, comprising:

a section of transmission line having a distributed inductance; and an array of superconducting quantum interference devices (SQUID's) connected electrically in parallel with and distributed along the section of transmission line, each SQUID having a variable inductance;

wherein a DC control current is applied to the SQUID's to vary their inductance and thereby the distributed inductance of the transmission line, thus controlling the propagation speed, or phase shift, of the signals applied to the phase shifter.

2. The superconducting variable phase shifter as set forth in claim 1, and further including an inductor for inductively coupling the DC control current to the SQUID's.

3. The superconducting variable phase shifter as set forth in claim 1, wherein the transmission line is a microstrip transmission line, the microstrip transmission line including:

a line conductor;

a ground plane; and a dielectric layer sandwiched between the conductor and ground plane;

wherein the SQUID's are arranged on and electrically connected in parallel with the ground plane.

4. The superconducting variable phase shifter as set forth in claim 3, wherein the SQUID's are double-junction SQUID's, each double-junction SQUID including:

two Josephson tunnel junctions disposed on the ground plane; and a superconducting loop connected between the two tunnel junctions.

5. The superconducting variable phase shifter as set forth in claim 3, wherein the SQUID's are single-junction SQUID's, each single-junction SQUID including:

a Josephson tunnel junction disposed on the ground plane; and a superconducting loop connected between the tunnel junction and the ground plane.

6. The superconducting variable phase shifter as set forth in claim 1, wherein the transmission line is a strip transmission line, the strip transmission line including:

a line conductor;

upper and lower ground planes; and upper and lower dielectric layers sandwiched between the conductor and the upper and lower ground planes;

wherein the SQUID's are arranged on and electrically connected in parallel with the lower ground plane.

7. The superconducting variable phase shifter as set forth in claim 6, wherein the SQUID's are single-junction SQUID's, each single-junction SQUID including:

a Josephson tunnel junction disposed on the lower ground plane; and a superconducting loop connected between the tunnel junction and the lower ground plane.

8. The superconducting variable phase shifter as set forth in claim 6, wherein the SQUID's are double-junction SQUID's, each double-junction SQUID including:

two Josephson tunnel junctions disposed on the lower ground plane; and a superconducting loop connected between the two tunnel junctions.

9. A method for controlling the propagation speed, or phase shift, of a signal, comprising the steps of:

inductively coupling a plurality of superconducting quantum interference devices to a section of transmission line, each SQUID having a variable inductance and the section of transmission line having a distributed inductance;

applying a signal to the transmission line; and varying the inductance of the plurality of SQUID's to vary the distributed inductance of the section of transmission line, thus controlling the propagation speed, or phase shift of the signal applied to the transmission line.

10. A superconducting variable phase shifter for controlling the propagation speed, or phase shift, of signals applied to the phase shifter, comprising:

signal transmission means having a distributed inductance; and variable-inductance superconducting quantum interference device (SQUID) means inductively coupled to the signal transmission means;

wherein the variable-inductance SQUID means varies the distributed inductance of the signal transmission means, thus controlling the propagation speed, or phase shift, of the signals applied to the phase shifter.

11. The superconducting variable phase shifter as set forth in claim 10, wherein the signal transmission means is a microstrip transmission line.

12. The superconducting variable phase shifter as set forth in claim 10, wherein the signal transmission means is a strip transmission line.

* * * * *